Figure 1A:
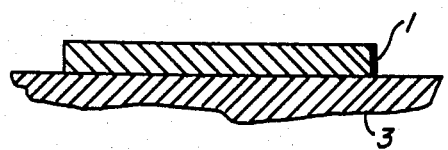

United States Patent [19]

Nemanich et al.

[11] Patent Number: 4,529,619

[45] Date of Patent: Jul. 16, 1985

[54] OHMIC CONTACTS FOR HYDROGENATED AMORPHOUS SILICON

[75] Inventors: Robert J. Nemanich, Cupertino; Malcolm J. Thompson, Palo Alto, both of Calif.

[73] Assignee: Xerox Corporation, Stamford, Conn.

[21] Appl. No.: 631,414

[22] Filed: Jul. 16, 1984

[51] Int. Cl.³ .......................................... H01L 21/324
[52] U.S. Cl. ........................................ 427/86; 427/74; 427/87; 427/88; 427/93
[58] Field of Search .................. 427/88, 93, 86, 87, 427/74

[56] References Cited

U.S. PATENT DOCUMENTS

| | | | |
|---|---|---|---|
| 3,927,225 | 12/1975 | Cordes et al. | 427/84 |
| 3,965,279 | 6/1976 | Levinstein et al. | 427/89 |
| 3,968,272 | 7/1976 | Anand | 427/84 |
| 4,180,596 | 12/1979 | Crowder et al. | 427/42 |
| 4,322,453 | 3/1982 | Miller | 427/89 |
| 4,407,710 | 10/1983 | Moustakas | 427/74 |
| 4,446,168 | 5/1984 | Kato | 427/86 |

FOREIGN PATENT DOCUMENTS 58-96726  6/1983  Japan ........................ 427/86

OTHER PUBLICATIONS

Matysik et al., "Hydrogen Evolution from Plasma-Deposited Amorphous Silicon Films", J. Vac. Sci. Technol. 15(2), Mar./Apr. 1978, pp. 302-304.
IBM Technical Disclosure Bulletin, vol. 19, No. 9, Feb. 1977, "Contact Barrier Metallurgy for Mosfet Gate", P. L. Garbarino et al.

*Primary Examiner*—John D. Smith
*Attorney, Agent, or Firm*—Richard A. Tomlin

[57] ABSTRACT

A method of forming an ohmic contact between an amorphous silicon hydride semiconductor and a substrate which includes coating a film of palladium on the substrate and overcoating the palladium with a thin film of amorphous silicon hydride forming a thin palladium silicide layer. The amorphous silicon hydride is dehydrogenated by annealing forming a highly defective amorphous silicon layer and a thicker palladium silicide layer through which carriers can readily tunnel. The amorphous silicon hydride semiconductor is then coated over the amorphous silicon layer to the desired thickness.

2 Claims, 4 Drawing Figures

OHMIC CONTACTS FOR HYDROGENATED AMORPHOUS SILICON

This invention relates to a method for forming a stable ohmic contact between a substrate and an amorphous silicon hydride semiconductor.

In the past, there have been a number of problems associated with the formation of uniform, reproducible and stable ohmic or injecting contacts to amorphous silicon hydride. For example, typical ohmic contact layer materials sometimes exhibit diffusion through the amorphous silicon hydride layer resulting in ill-defined or dimensionally irregular contact and semiconductor regions and, in the extreme case, catastrophic degradation of the semiconductor properties of the material. Further, an oxide barrier may form at the interface which limits electrical conductivity. Finally, in the prior art, in order to achieve ohmic contacts, it was required that a highly doped (N+ layer) film be deposited on the substrate before the amorphous silicon hydride deposition in order to reduce barrier formation at the metal-semiconductor interface.

The invention as claimed is intended to provide a remedy for the above problems. The invention as claimed provides a method for forming stable ohmic contact between, for example, a metal and amorphous silicon hydride which is not subject to the diffusion or oxidation problems, and which does not require a heavily doped N+ layer.

The above advantages and others are obtained in accordance with this invention by depositing a palladium film on the conducting or nonconducting substrate, overcoating the substrate with an amorphous silicon hydride film and annealing the structure at a temperature of about 400° C. After cooling, an amorphous silicon hydride semiconductor layer of the desired thickness is deposited over the silicon and palladium layers. The annealing process provides a highly defective unhydrogenated region through which carriers can easily tunnel.

These and other features of the invention are set out in detail in the description that follows and may be best understood when considered in conjunction with the drawing in which:

FIGS. 1A–1D are cross-sectional views of a device showing the various manufacturing steps in accordance with the preferred embodiment of the present invention.

The Figures are not drawn to scale, the layers being greatly exaggerated in thickness for purposes of explanation.

Referring now to FIG. 1A, there is seen the first step of the operation which is to coat an approximately 200 Å thick film of palladium metal 1 on an aluminum substrate. The palladium film 1 may be deposited by any well-known technique such as sputtering, thermal evaporation, electron beam evaporation or any other hydrogen-free deposition system.

Figure 1B:
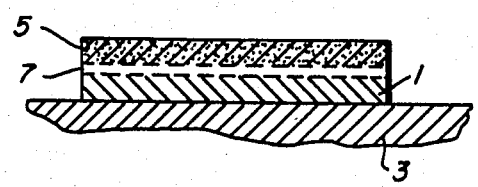

Referring now to FIG. 1B, a film of amorphous silicon hydride 5 of about the same thickness as the palladium film 1 is deposited on the palladium film 1. The preferred method of deposition is by the plasma decomposition of silane. Since palladium does not oxidize rapidly, the transfer of the unprotected palladium film 1 on substrate 3 to the plasma deposition chamber does not cause significant oxidation. The plasma deposition of amorphous silicon hydride film 5 on palladium film 1 causes the formation of a thin layer of palladium silicide 7 at the interface of the palladium film 1 and the amorphous silicon hydride film 5. The layered structure of substrate 3, palladium film 1, palladium silicide layer 7 and amorphous silicon hydride film 5 is then annealed at a temperature of about 400° C. for a period of time of about half an hour and at a reduced pressure of about 1 torr providing the layered structure as shown FIG. 1C.

Figure 1C:
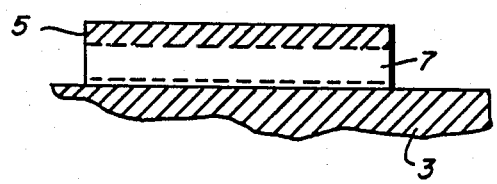

Referring now to FIG. 1C, the annealing has caused the dehydrogenation of film 5 resulting in film 5 now comprising amorphous silicon. Further, the annealing has caused the growth of the palladium silicide layer 7 to encompass virtually all of the palladium film 1 and part of the amorphous silicon film 5.

Figure 1D:
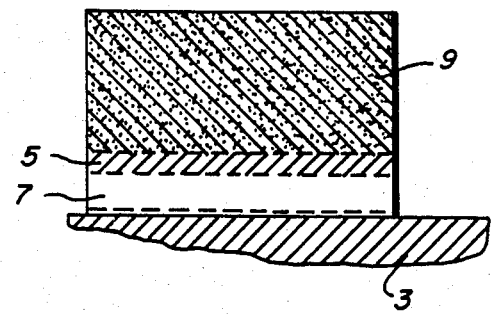

Referring to FIG. 1D, the final step in the process is to deposit the desired thickness of amorphous silicon hydride, again by the plasma deposition of silane, on to the amorphous silicon film 5.

It has been found that the dehydrogenation of the amorphous silicon film 5 leaves a highly defective amorphous silicon region through which carriers can readily tunnel.

It should be noted that while the annealing step is preferably performed in a vacuum, this step may also be carried out in the presence of sweeping inert gases such as nitrogen or argon.

Various additional modifications will become apparent to those skilled in the art. All such modifications as encompassed by the following claims should be considered within the spirit and scope of the invention.

What is claimed is:

1. The method of forming an ohmic contact between a semiconductor and a substrate which comprises the following steps:
   (a) coating a film of palladium on the substrate,
   (b) overcoating the film of palladium with a film of amorphous silicon hydride,
   (c) heating said substrate, palladium and amorphous silicon hydride layer until a defective amorphous silicon film has been formed, and
   (d) coating said amorphous silicon film with the semiconductor.

2. The method of claim 1 wherein said semiconductor is amorphous silicon hydride.

* * * * *